(12) United States Patent
Manens

(10) Patent No.: US 11,820,651 B2
(45) Date of Patent: Nov. 21, 2023

(54) MASS TRANSFER TOOL WITH HIGH PRODUCTIVITY

(71) Applicant: Apple Inc., Cupertino, CA (US)

(72) Inventor: Antoine Manens, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 243 days.

(21) Appl. No.: 17/345,266

(22) Filed: Jun. 11, 2021

(65) Prior Publication Data

US 2022/0135400 A1     May 5, 2022

Related U.S. Application Data

(60) Provisional application No. 63/109,752, filed on Nov. 4, 2020.

(51) Int. Cl.
| | |
|---|---|
| *B81C 99/00* | (2010.01) |
| *H01L 25/075* | (2006.01) |
| *H05K 13/04* | (2006.01) |
| *H05K 13/08* | (2006.01) |

(52) U.S. Cl.
CPC ........ *B81C 99/002* (2013.01); *H01L 25/0753* (2013.01); *H05K 13/0413* (2013.01); *H05K 13/0812* (2018.08)

(58) Field of Classification Search
CPC .............. B81C 99/002; H01L 25/0753; H05K 13/0413; H05K 13/0812
See application file for complete search history.

(56) References Cited

U.S. PATENT DOCUMENTS

| | | | |
|---|---|---|---|
| 3,916,203 A * | 10/1975 | Norgren ............... | G03B 42/025 378/177 |
| 6,863,109 B2 | 3/2005 | Kim et al. | |
| 7,012,684 B1 * | 3/2006 | Hunter .............. | H01L 21/67253 250/559.44 |
| 10,438,339 B1 * | 10/2019 | Czarnota ............... | G06T 7/0008 |
| 2014/0071580 A1 * | 3/2014 | Higginson .............. | H01L 24/95 361/234 |
| 2016/0094161 A1 * | 3/2016 | Bathurst ............... | B81C 99/002 361/234 |
| 2017/0140961 A1 * | 5/2017 | Sasaki .................. | H01L 25/0753 |
| 2018/0076076 A1 * | 3/2018 | Bathurst ........... | H01L 21/67288 |

(Continued)

FOREIGN PATENT DOCUMENTS

| | | |
|---|---|---|
| KR | 20080022481 A | 3/2008 |
| WO | 2014039335 A1 | 3/2014 |
| WO | 2016160322 A1 | 10/2016 |

OTHER PUBLICATIONS

PCT/US2021/056228, "PCT Invitation to Pay Additional Fees and, Where Applicable, Protest Fee", dated May 25, 2022, 11 Pages.

(Continued)

*Primary Examiner* — Tracie Y Green
(74) *Attorney, Agent, or Firm* — Aikin & Gallant, LLP

(57) ABSTRACT

Mass transfer tools and methods for high density transfer of arrays of micro devices are described. In an embodiment, a mass transfer tool includes a plurality of articulating transfer head assemblies coupled with a main translation track, where each articulating transfer head assembly is translatable along the main translation track between a donor substrate stage and a receiving substrate stage.

22 Claims, 10 Drawing Sheets

(56) References Cited

U.S. PATENT DOCUMENTS

2020/0243358 A1  7/2020  Kwag et al.
2022/0013380 A1* 1/2022  Kim ...................... B65G 47/90

OTHER PUBLICATIONS

PCT/US2021/056228, "PCT Notification of Transmittal of the International Search Report and the Written Opinion of the International Searching Authority, or the Declaration", dated Jul. 18, 2022, 15 pages.

* cited by examiner

MASS TRANSFER TOOL WITH HIGH PRODUCTIVITY

RELATED APPLICATIONS

This application claims the benefit of priority of U.S. Provisional Application No. 63/109,752 filed Nov. 4, 2020, which is hereby incorporated by reference.

BACKGROUND

Field

Embodiments described herein relate to systems and methods for transferring micro devices.

Background Information

Integration and packaging issues are one of the main obstacles for the commercialization of micro devices such as radio frequency (RF) microelectromechanical systems (MEMS) microswitches, light-emitting diodes (LEDs), and MEMS or quartz-based oscillators.

Traditional technologies for transferring of devices such as "direct printing" and "transfer printing" include transfer by wafer bonding from a transfer wafer to a receiving wafer. In both traditional and variations of the direct printing and transfer printing technologies, the transfer wafer is de-bonded from a device after bonding the device to the receiving wafer. In addition, the entire transfer wafer with the array of devices is involved in the transfer process.

In one process variation a transfer tool including an array of electrostatic transfer heads is used to pick up and transfer an array of micro devices from a carrier (donor) substrate to a receiving substrate. In such an implementation, the transfer heads operate in accordance with principles of electrostatic grippers, using the attraction of opposite charges to pick up the micro devices. In a particular implementation it has been suggested to use an array of electrostatic transfer heads to populate a display backplane with an array of micro LED devices, in which sequential pick and place transfer operations are performed to populate the display backplane with a plurality of different color-emitting micro LEDs from different donor substrates. The cycle time for the tool is determined by the average time from one pick to the next pick, inclusive of any downtime for inspection, maintenance, etc.

SUMMARY

Mass transfer tools and methods for high density transfer of arrays of micro devices are described. In accordance with embodiments, tool throughput can be increased by incorporating various combinations of multiple articulating transfer head assemblies and multiple transfer lanes which can have a variety of configurations including linear, looped and combinations thereof.

In an embodiment, a mass transfer tool (MTT) includes a receiving substrate stage, a donor substrate stage, a main translation track, and a plurality of articulating transfer head assemblies coupled with the main translation track. Each articulating transfer head assembly may be translatable along the main translation track between the donor substrate stage and the receiving substrate stage. Various additional subsystems or stations can be located along the main translation track, or positionable thereto, such as a cleaning station, micro pick up array (MPA) loading station, inspection station, etc.

In an embodiment, an MTT includes a plurality of subsystems including a donor substrate stage, a pre-placement inspection station, a receiving substrate stage, and a post-placement inspection station. The MTT may additionally include one or more articulating transfer head assemblies, and a motion system to position the one or more articulating transfer head assemblies over the plurality of subsystems in a looped sequence. Likewise, additional subsystems can be integrated such as a cleaning station or MPA loading station. Various subsystems may also be combined into a single station.

DETAILED DESCRIPTION

Figure 1A:
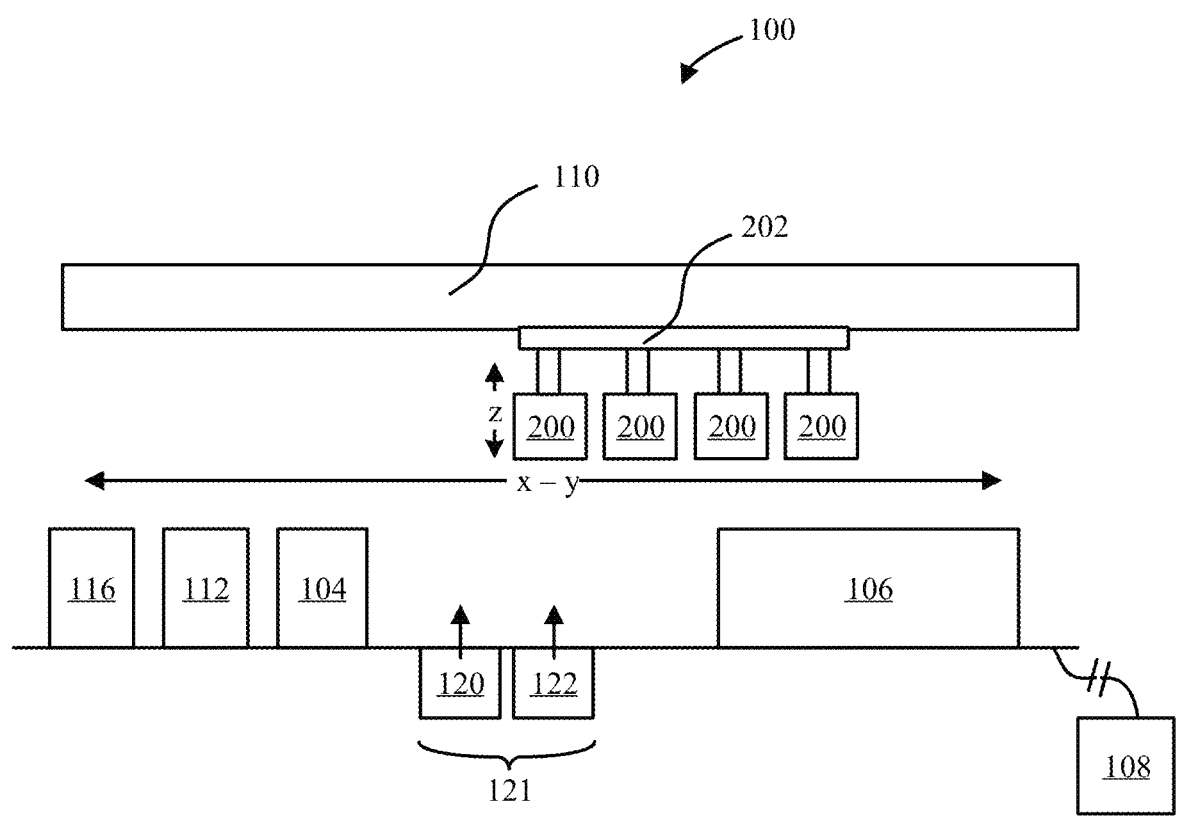
FIGS. 1A-1B are schematic illustrations of a mass transfer tool assemblies in accordance with embodiments.

Embodiments describe mass transfer tool (MTT) assemblies and methods of operation that enable picking up a high density of micro devices from one or more donor substrates with a plurality of articulating transfer head assemblies and placement of groups of the micro devices onto one or more receiving substrates. In accordance with embodiments, tool throughput can be increased by incorporating various combinations of multiple articulating transfer head assemblies and multiple transfer lanes.

In an embodiment, each articulating transfer head assembly carries a micro pick up array (MPA) that, depending upon size of the MPA and specifications for the receiving substrate, may include thousands of individual transfer heads. The transfer heads in accordance with embodiments can be designed for various modes of operation. For example, the transfer heads can include elastomeric contact surfaces for pick and place, include vacuum holes, or operate in accordance with electrostatic principles in order to generate higher gripping pressure and reduced size. The transfer heads can include mesa structures to provide localized contact points for the transfer heads. The electrostatic transfer heads may be monopolar, or multi-polar (e.g. bipolar, etc.). For example, multi-polar transfer heads may be utilized to mitigate against residual charge buildup or provide a charge differential where the target substrate (e.g. donor, receiving, display) is not maintained at a reference voltage.

In the following description various embodiments are described with particular reference to tools and methods for transfer of micro light emitting diodes (LEDs). It is to be appreciated that the MTT and sequences can also be applied to other applications to increase throughput for the population of devices, and specifically micro devices. The terms "micro" device or "micro" LED as used herein may refer to the descriptive size of certain devices or structures in accordance with embodiments. As used herein, the term "micro" is meant to refer to the scale of 1 to 300 For example, each micro device may have a maximum length or width of 1 to 300 µm, 1 to 100 µm, or less. In some embodiments, the micro LEDs may have a maximum length and width of 20 µm, 10 µm, or 5 µm. However, it is to be appreciated that embodiments of the present invention are not necessarily so limited, and that certain aspects of the embodiments may be applicable to larger, and possibly smaller size scales.

In one aspect, embodiments describe an MTT in which multiple articulating transfer head assemblies are attached to the same main translation track or carriage at a fixed pitch that can be a multiple of the end product pitch on a mother substrate (e.g. display glass). In such an embodiment, articulating transfer head assemblies can pick sequentially from the same or different donor substrates (e.g. uLED donor), be scanned sequentially over an inspection station and placed either sequentially or simultaneously onto different regions of the mother substrate or different receiving substrates. This may increase the cycle time of the tool but will also increase the productivity of the tool by reducing total travel distance required to make multiple transfers. In another aspect, multiple donor substrate holders can be installed in the MTT. Each donor substrate holder may have the ability to move both in x, y and theta (rotational) directions. This will allow multiple articulating transfer head assemblies to pick up simultaneously, which may reduce the nonproductive time of the tool and reduce the cycle time of the tool. For example, the donor substrate stages may be adjustable for gross alignment of different donor substrates, while each articulating transfer head assembly is further adjustable in six degrees of motion for fine alignment. In an embodiment, a first set of articulating transfer head assemblies is attached to a first carriage coupled to the main translation track, and a second set of articulating transfer head assemblies attached to a second carriage coupled to the main translation track. Use of separate carriages may reduce a degree of freedom of movement needed for one of the donor substrate holders. A further extension to reduce cycle time and travel distance is to have the tool populate only half of the receiving substrate (the half closest to the donor substrate). Once the first half is completed, the receiving substrate can be rotated and brought back to the same or a different tool to process the other half.

In accordance with embodiments, one or more counter-weights can be installed that move in opposing motion to the articulating transfer head assemblies. The motion profiles can be matched so that the inertia from the counter-weight cancels out the inertia from the articulating transfer head assembly(s) (along with the attached holder, motor, and bearing, as well as any other moving subsystems such as a review camera). Such a configuration may reduce settling time (time is takes for the tool to reach position stability) and the overall cycle time. A further extension is to implement single pick multi place (SPMP) in conjunction, where each transfer head assembly will sequentially release a portion of the micro devices onto different locations of the receiving substrate, or onto different receiving substrates.

In another embodiment, the MTT subsystems may be arranged in a loop architecture (e.g. circular, elliptical, etc.). In a loop architecture a carousel with multiple articulating transfer head assemblies can rotate accurately. Each articulating transfer head assembly may by located over a specific station, for example, donor substrate (or MPA loading), pre-placement inspection station (e.g. upward facing inspection camera and/or line scan camera), receiving substrate (e.g. mother glass), post-placement inspection station (e.g. upward facing inspection camera and/or line scan camera), or cleaning station. The carousel may increment at every cycle. Thus, the cycle time of the MTT may include the motion time plus the longest step out of the various stations (e.g. placing operation on the receiving substrate). Such a tool architecture may have a much shorter cycle time compared to a linear system since all the station or subsystem operations are pipelined instead of being executed in series. Various extensions of the loop architecture include having two articulating transfer heads side-by-side on the carousel. Another extension is to include two carousels on opposite sides of the receiving substrate.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

Figure 1B:
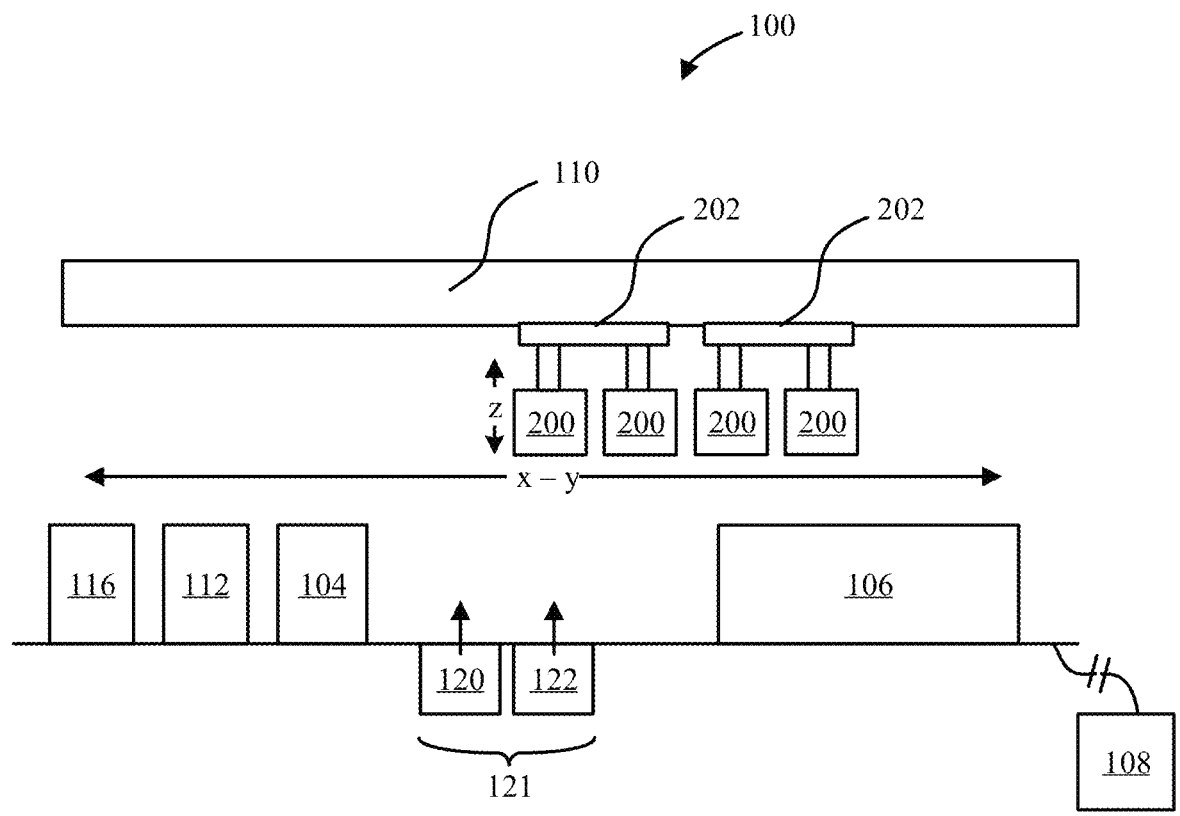

FIGS. 1A-1B are schematic illustrations of mass transfer tools 100 in accordance with embodiments. Mass transfer tool 100 may include one or more articulating transfer head assemblies 200, each for picking up an array of micro devices from a carrier (donor) substrate held by a donor substrate stage 104 and for transferring and releasing the array of micro devices onto a receiving substrate (e.g. mother glass) held by a receiving substrate stage 106. In an embodiment, an inspection station 121 subsystem is located between the donor substrate stage 104 and the receiving substrate stage 106. For example, this may include an upward facing inspection camera 120 and/or line scan camera 122. In this manner, the underside of an articulating transfer head assembly 200 (e.g. a micro pick up array carrying a group of micro devices) may be inspected while the articulating transfer head assembly 200 moves between the donor substrate stage 104 and receiving substrate stage 106 to verify efficacy of the transfer operations. In an embodiment, the upward facing inspection camera 120 may be used to identify a fiducial (e.g. encoder) on the micro pick up array 103 (MPA, see FIG. 2) or other part of the articulating transfer head assembly 200, which can trigger the line scan camera 122 to stitch an image of the bottom surface of the MPA to identify the presence or absence of micro devices held by the MPA, as well as offset of the micro devices from the array of transfer heads. The MTT 100 may additionally include a cleaning station 116 and an MPA loading station 112. For example, the cleaning station 116 may include a substrate for cleaning or removal of debris or micro devices from the MPA. Such a substrate may include a tacky coating, or alternatively an electrostatic pattern. The MPA loading station 112 may include a plurality of staging areas to supply or replace the MPAs. Operation of mass transfer tool 100 and articulating transfer head assembly 200 may be controlled at least in part by a computer 108.

Figure 2:
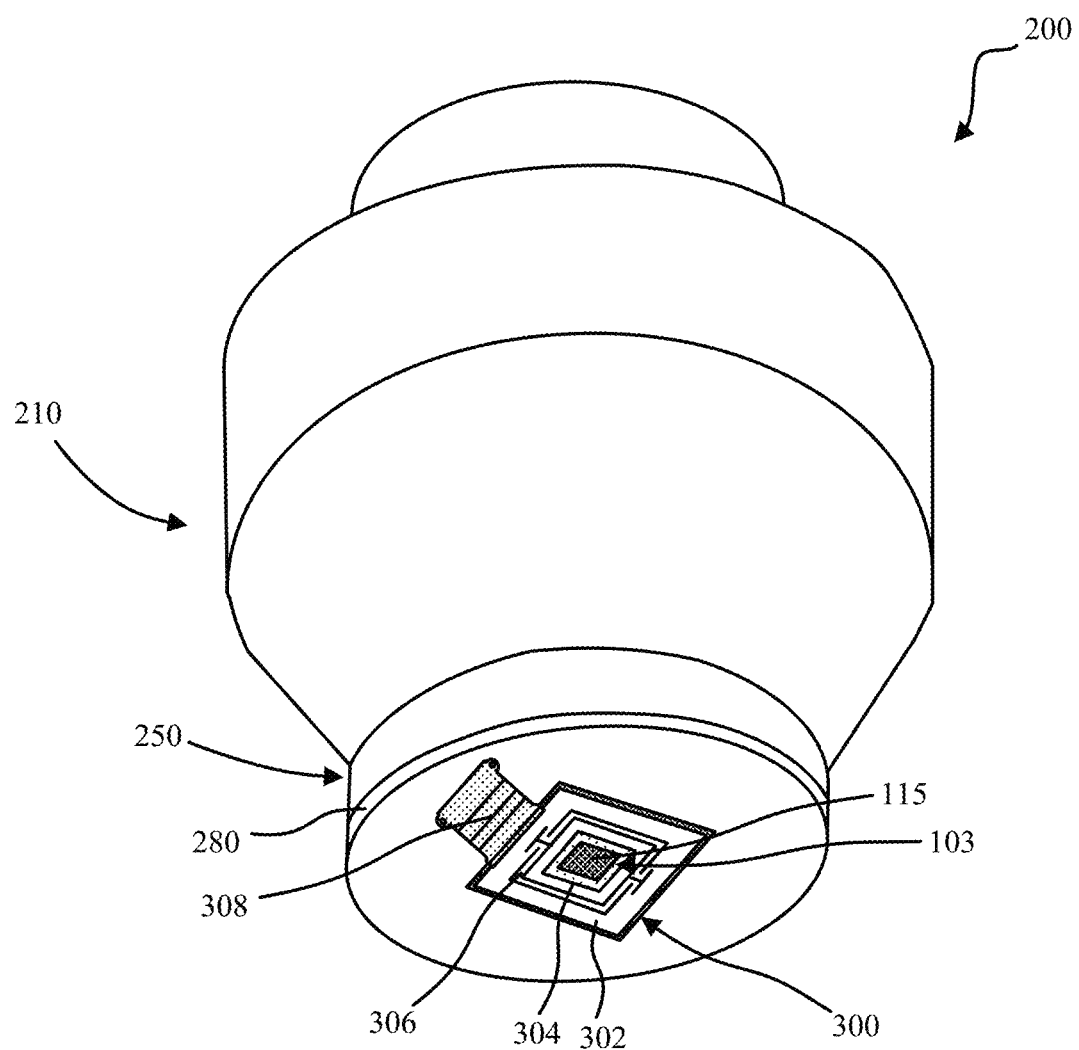
FIG. 2 is an isometric view illustration of a micro pick up array and pivot mount mounted onto an articulating transfer head assembly in accordance with an embodiment.

Referring now to FIG. 2, a perspective view of an articulating transfer head assembly 200 is shown in accordance with an embodiment. An articulating transfer head assembly 200 may be used in the mass transfer tool 100 to transfer micro devices to or from a substrate, e.g., receiving substrate or donor substrate, using micro pick up array (MPA) 103 which is supported by a pivot mount assembly 300. The pivot mount assembly 300 may include a support structure (e.g. base) 302, a pivot platform 304, and plurality of spring arms 306, and the MPA 103 supporting an array of electrostatic transfer heads 115 is mounted on the pivot platform 304. In an embodiment, the pivot mount assembly 300 may include a flex circuit 308 to communicate with a printed circuit board (PCB) that is located nearby within the articulating transfer head assembly 200 to reduce signal degradation by limiting a distance that signals must travel.

In an embodiment, the MPA 103 includes an array of transfer heads 115. In a particular embodiment, each transfer head operates in accordance with electrostatic principles to pick up and transfer a corresponding micro device. Alternatively, each transfer head may include an elastomeric surface to pick up and transfer a corresponding micro device using Van de Waals forces. In an embodiment each transfer head has a localized contact surface characterized by a maximum dimension of 1-300 µm in both the x- and y-dimensions. In an embodiment, each transfer head contact surface has a maximum lateral dimension of 1 to 100 µm or less. In some embodiments, each transfer head contact surface has a maximum length and width of 20 µm, 10 µm, or 5 µm. Similarly, each micro device, such as an LED or chip, may have a maximum lateral dimension of 1-300 µm or 1-100 µm, such as 20 µm, 10 µm, or 5 µm. The articulating transfer head assembly 200 can include features that allow for the exchange of the MPA at an MPA loading station, and for delivering voltage(s) to the transfer heads to facilitate pick up of a micro device using an electrostatic force and/or holding the MPA 103 onto the pivot platform 304 using electrostatic force.

Referring to FIGS. 1A-1B and FIG. 2, computer 108 may control the operation of articulating transfer head assembly 200 of the MTT 100. For example, articulating transfer head assembly 200 may include an actuator assembly for adjusting the MPA 103 retained by the transfer head assembly with at least six degrees of freedom, e.g., tipping, tilting, rotation, and movement in x, y, and z directions, based on feedback signals received from various sensors of the MTT 100. Computer 108 may also control movement of the motor(s) and carriage(s) 202 for translating the articulating transfer head assembly(s) 200 along main translation track 110 (e.g. x direction) over the donor substrate stage 104 and receiving substrate stage 106 as well as the cleaning station 116 and MPA loading station 112. In the particular embodiment illustrated in FIG. 1A each articulating transfer head assembly 200 is attached to the same carriage 202 which can be driven by a motor. In the particular embodiment illustrated in FIG. 1B sets of articulating transfer head assemblies 200 can be attached to corresponding carriages 202, each being independently driven by a separate motor. Alternatively, each articulating transfer head assembly 200 can have its own corresponding carriage 202 and motor for independent movement. In an embodiment, the inspection station including the upward facing inspection camera 120 and/or line scan camera 122 may be located along the main translation track 110 between the donor substrate stage 104 and receiving substrate stage 106. Additional actuators may be provided, e.g., between mass transfer tool 100 structural components and articulating transfer head assembly 200, donor substrate stage 104, receiving substrate stage 106, cleaning station 116, and MPA loading station 112 to provide movement in the x, y, or z direction for one or more of those sub-assemblies. For example, a gantry may support articulating transfer head assembly 200 and move articulating transfer head assembly 200 along an upper beam or side rails, e.g., in a direction parallel to an axis of motion of main translation track 110. Thus, an array of transfer heads on MPA 103, supported by transfer head assembly 200, and a target substrate (e.g. supported by donor substrate stage 104 or receiving substrate stage 106) may be precisely moved relative to each other within all three spatial dimensions.

The articulating transfer head assembly 200 in accordance with embodiments may provide for negligible lateral or vertical parasitic motion for small movements of MPA 103, e.g., motion less than about 5 mrad about a neutral position. In an embodiment, the articulating transfer head assembly includes a tip-tilt assembly 210 and a piezoelectric stage assembly 250 mounted underneath the tip-tilt assembly 210. Together the tip-tilt assembly 210 and the piezoelectric stage assembly 250 may provide six degrees of motion. Specifically, the tip-tilt assembly 210 may provide tip ($\theta x$) and tilt ($\theta y$), where the piezoelectric stage assembly 250 provides z motion, x motion, y motion, and rotation ($\theta z$). In the particular embodiment illustrated a mounting plate 280 is secured underneath the piezoelectric stage assembly 250. The pivot mount assembly 300 may be mounted onto the mounting plate 280 using a variety of manners such as using tabs or lips to press the pivot mount assembly against the transfer head assembly 200, bonding, vacuum, electrostatic clamping, or pogo pin array board. The MPA 103 can be mounted on the pivot platform 304 of the pivot mount assembly 300 using suitable techniques such as electrostatic clamps, vacuum, or mechanical clips. In an embodiment, the MPA 103 is mounted onto the pivot platform 304 using electrostatic clamps to produce a strong holding force, which can be turned off for MPA replacement with the MPA loading station 112.

Figure 3:
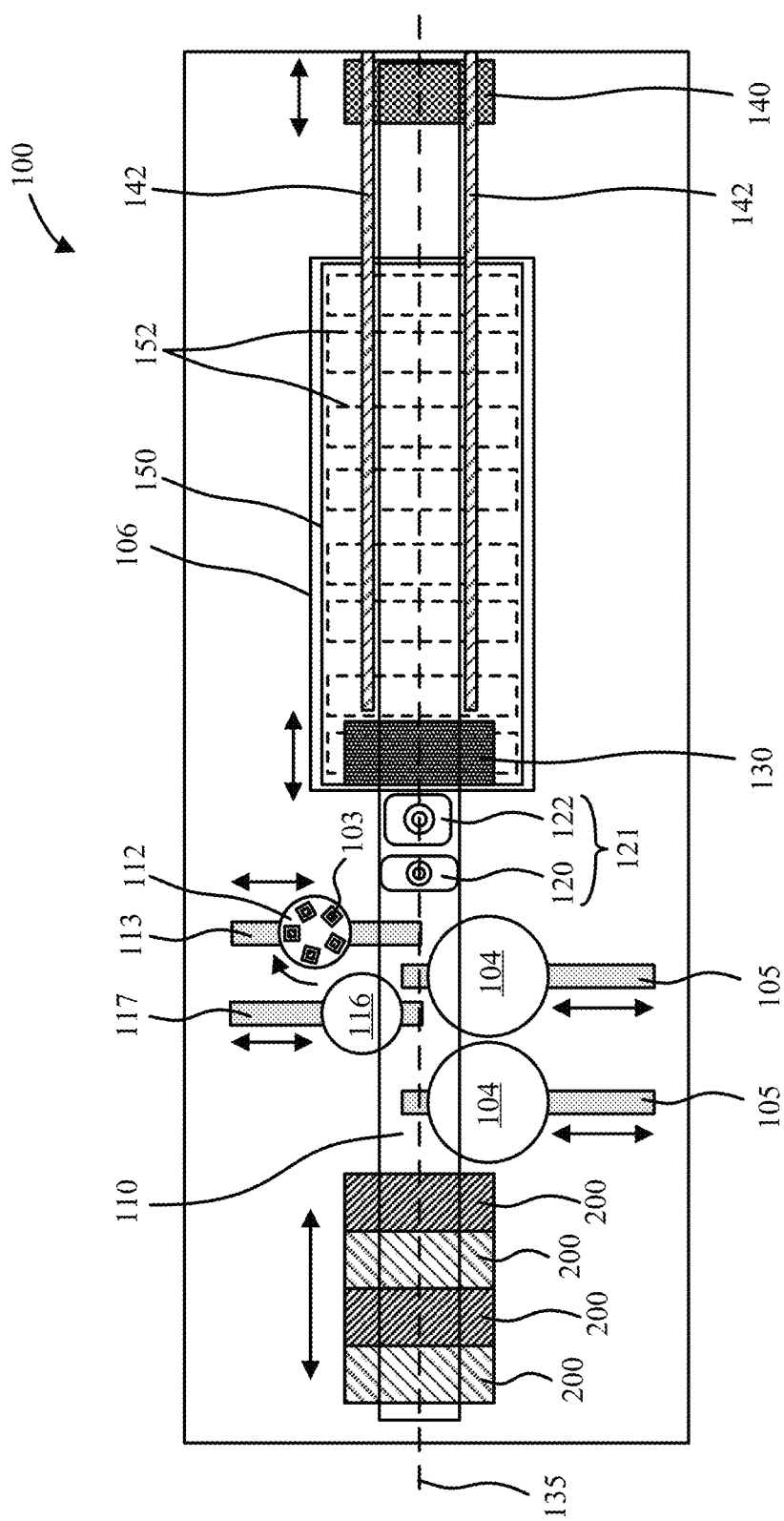
FIG. 3 is a schematic top view illustration of a mass transfer tool assembly in accordance with an embodiment.

Referring now to FIG. 3 a schematic top view illustration is provided of an MTT 100 assembly in accordance with an embodiment. In particular, the MTT 100 is a linear assembly with various stations or sub-assemblies located adjacent to or along the main translation track 110. As shown, the mass transfer tool 100 can include a receiving substrate stage 106, which can hold one or more receiving substrates 150, such as a mother glass for display application. The receiving substrate 150 may be patterned into a plurality of regions 152, for example, which may correspond to separate end product areas (e.g. display panels) that can be scribed or peeled to form multiple products from the same receiving substrate 150. The receiving substrate 150 may be secured to the receiving substrate stage 106 using a variety of techniques including gravity, clips, vacuum, etc. Similarly, a donor substrate can be secured to a donor substrate stage 104 using a variety of techniques including gravity, clips, vacuum, etc.

As shown in FIG. 3, the MTT 100 may include one or more donor substrate stages 104. For micro LED transfer, the donor substrates may be patterned wafers including thousands of micro LEDs that have been processes to that they are poised for pick up and transfer to the receiving substrate with an articulating transfer head assembly 200. Each donor substrate stage may optionally be moveable in any or all of x, y and/or theta directions. Alternatively, different donor substrate stages 104 may have different degrees of freedom. For example, where two donor substrate stages are included, at least one of them is movable in at least two degrees of motion, including a direction (e.g. x-direction) parallel to the longitudinal axis 135 of the main translation track 110. This allows gross alignment of two adjacent donor substrate stages 104 with the articulating transfer head assemblies. Alternatively, the articulating transfer head assemblies 200 may be attached to different carriages 202, or sets/groups of articulating transfer head assemblies 200 can be attached to different carriages 202 to remove a degree of freedom (e.g. x-direction) for both of the donor substrate stages 104, thus simplifying the tool. Each donor substrate stage 104 may optionally be secured to a donor substrate stage translation track 105 that is translatable between an operable location directly overlapping the main translation track 110 and an inoperable location away from the main translation track 110. In an exemplary implementation, each donor substrate stage translation track 105 is in a direction orthogonal to the longitudinal axis 135 (e.g. y-direction). Such y-motion may be in addition to, or part of the x, y and/or theta direction degrees of freedom of the donor substrate stage. Thus, the donor substrate stage may be movable in the y-direction in addition to being translatable along the donor substrate stage translation track 105 in the exemplary embodiment. Multiple donor substrate stages 104 may be included for a variety of reasons, such as loading a new donor substrate while another donor substrate is used in a transfer sequence, or a transfer sequence in which multiple articulating transfer head assemblies 200 can pick up from multiple donor substrates.

In the particular embodiment illustrated in FIG. 3, four articulating transfer head assemblies 200 are illustrated as being coupled with the main translation track 110 and translatable along the main translation track 110 between the donor substrate stage(s) 104 and the receiving substrate stage(s) 106. While four articulating transfer head assemblies 200 are illustrated, this is exemplary, and embodiments are not limited to a specific amount. In an embodiment, the articulating transfer head assemblies 200 are coupled with the main translation track (e.g. on carriage 202) at a fixed pitch to one another. Also, the articulating transfer head assemblies 200 may be coupled with a carriage 202 at a fixed pitch, and where multiple carriages carry multiple articulating transfer head assemblies 202 the multiple carriages may be independently moveable. For example, this fixed pitch may correspond to a multiple of the regions 152 on the receiving substrate 150, which may also correspond to an end product pitch. For example, each region 152 may correspond to a display panel that can be scribed or peeled from the receiving substrate 150 (e.g. mother glass). Alternatively, the articulating transfer head assemblies can be coupled with the translation track with different carriages 202, or sets/groups of articulating transfer head assemblies can be attached to different carriages.

Referring again to FIG. 1B, in the illustrated embodiment two articulating transfer head assemblies 200 are attached to a corresponding carriage 202. In an exemplary use, the first and third articulating transfer head assemblies can be positioned over the two donor substrate stages 104 of FIG. 3 simultaneously. Furthermore, the corresponding carriage 202 position for the first and third articulating transfer head assemblies 202 can be independently adjusted. In this manner, this can free up a degree of freedom (e.g. x-translation) of one of the donor substrate stages 104, further simplifying the tool. Once a pick operation is performed, the second and fourth articulating transfer head assemblies 200 can be independently positioned over the two donor substrate stages 104 for a second pick operation.

The MTT 100 in accordance with embodiments may optionally include a cleaning station 116. The cleaning station 116 may optionally be translatable along a cleaning station translation track 117 between a cleaning location directly overlapping the main translation track 110 and a non-cleaning location away from the main translation track 110. In this manner, the articulating transfer head assemblies 200 can be positioned over the cleaning station 116. The cleaning station 116 may optionally be moveable in any or all of x, y and/or theta directions. The cleaning station 116 may include a cleaning substrate for cleaning or removal of debris or micro devices from the MPA. Such a cleaning substrate may include a tacky coating, or alternatively an electrostatic pattern. Similar to the donor substrate stage 104, the cleaning station 116 may secure the cleaning substrate using a variety of techniques including gravity, clips, vacuum, etc. Inclusion of the cleaning station 116 can allow integration of a maintenance station directly into the transfer sequence path, and reduce downtime. While a straight cleaning station translation track 117 is illustrated, this is not required, and the cleaning station translation track 117 can be curved, etc.

In accordance with embodiments, one or more inspection stations 121 may be included in the MTT 100. For example, an inspection station may include and upward facing inspection camera 120 and/or line scan camera 122. In an embodiment, the plurality of articulating transfer head assemblies 200 is translatable along the main translation track 110 and directly over the inspection station 121. The inspection station 121 may be in a fixed location, though it can also be translatable and/or moveable in any or all of x, y and/or theta directions. In operation, the upward facing inspection camera 120 may be used to identify a fiducial (e.g. encoder) on the micro pick up array 103 or other part of the articulating transfer head assembly 200, which can trigger the line scan camera 122 to stitch an image of the bottom surface of the MPA 103. After pick up from the donor substrate, the image may identify the presence or absence of micro devices held by the MPA 103, as well as offset of the micro devices from the array of transfer heads. This information may be used to determine whether to proceed with the placement sequence, or to calculate a placement offset when positioning the articulating transfer head assemblies 200 over the receiving substrate. Alternatively, this information can be used to trigger a cleaning operation with the cleaning station 116 or interchange the MPA 103 with the MPA loading station 112. Once placement has occurred, the articulating transfer head assemblies 200 can then be translated back toward the donor substrate stage(s) 104 for subsequent pick operations. During this translation, the articulating transfer head assembles 200 may then again track directly over the inspection station 121, where the bottom surface of the MPA 103 is again scanned. Information from this can likewise be used to determine whether to proceed with the next pick operation, trigger a cleaning operation with the cleaning station 116, or to interchange the MPA 103 with the MPA loading station 112.

In accordance with embodiments, the MTT may include a counter-weight 140 that is translatable parallel to the longitudinal axis 135. The counter-weight may include a single weight, or multiple weights. The counter-weight 140 can be coupled with the main translation track 110, or with a separate counter translation track 142 located adjacent to the main translation track 110. For example, the counter translation track 142 may be above, below, or on opposite sides of the main translation track 110 for weight balancing. In an embodiment, counter-weights are coupled to the counter translation track 142 on opposite sides of the main translation track 110. In this configuration their center of mass may be coincident with the longitudinal axis 135, and the plurality of articulating transfer head assemblies, etc. Arrangement along the counter translation track 142 may additionally help avoid collisions with other systems along the main translation track 110 and still allow the counter-weights to cancel out inertia from the articulating transfer head assembly(s) and review camera, and reduce settling time. The counter-weight may be independently translatable along the main translation track 110 or counter track 142. Thus, the counter-weight 140 and plurality of articulating transfer head assemblies 200 may be connected to separate motors, and carriages attached to their respective translation tracks. Additionally, a review camera 130 can be coupled with the main translation track 110, and likewise be independently translatable along the main translation track 110, for example, with a separate motor and carriage. The counter-weight 140 may be installed to move in an opposing direction as the articulating transfer head assemblies 200, as well as the review camera 130, to cancel out inertia from the articulating transfer head assembly(s) and review camera 130, and reduce settling time. The review camera 130 may be used to inspect the receiving substrate 150 before and/or after transfer of the micro devices. This information can be used to further validate the transfer sequence and detect errors, or misplaced or non-transferred micro devices.

Still referring to FIG. 3, the MPA loading station 112 may optionally be translatable along a loading station translation track 113 between a loading location directly overlapping the main translation track 110 and a non-loading location away from the main translation track 110. In this manner, the articulating transfer head assemblies 200 can be positioned over the MPA loading station 112. While a straight loading station translation track 113 is illustrated, this is not required, and the loading station translation track 113 can be curved, etc. The MPA loading station 112 may optionally be moveable in any or all of x, y and/or theta directions. In an embodiment, the MPA loading station 112 includes a plurality of support structures that can be raised above a base structure of the MPA loading station to either receive or donate an MPA 103. The MPA loading station 112 may also be rotatable so as to position a specific MPA 103 or support structure underneath an articulating transfer head assembly 200.

Figure 4A:
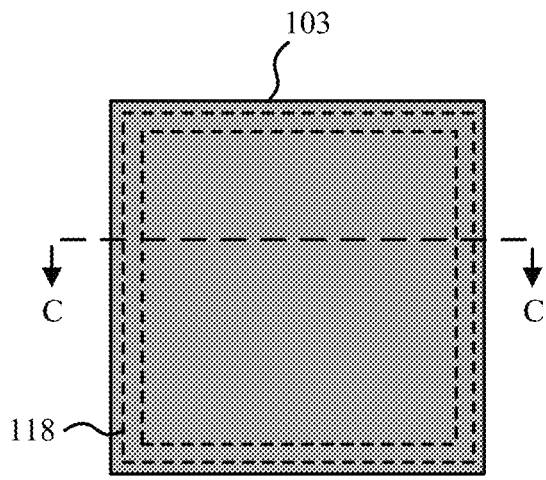
FIG. 4A is a schematic top-down view illustration of a micro pick up array supported by an annular support structure of a micro pick up array loading station in accordance with an embodiment.
Figure 4B:
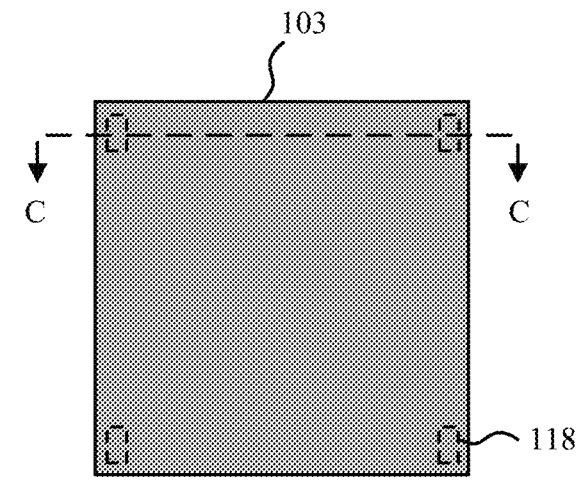
FIG. 4B is a schematic top-down view illustration of a micro pick up array supported by a plurality of support structures of a micro pick up array loading station in accordance with an embodiment.
Figure 4C:
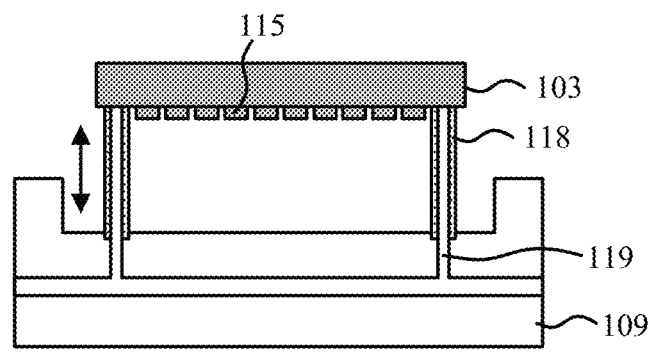
FIG. 4C is a schematic cross-sectional side view illustration of a micro pick up array supported by one or more support structures in accordance with an embodiment.

Referring now to FIGS. 4A-4C schematic top-down and cross-sectional side view illustrations are provided of an MPA 103 supported by one or more support structures 118 of an MPA loading station 112. In the embodiment illustrated in FIG. 4A, the MPA 103 may be supported by an annular support structure 118. In the embodiment illustrated in FIG. 4B, the MPA 103 may be supported by a plurality of support structures 118, which can be shaped as columns, walls, etc. FIG. 4C is a schematic cross-sectional side view illustration taken along line C-C of either FIG. 4A or FIG. 4B. As shown in FIG. 4C, the one or more support structures 118 can be raised relative to a base structure 109 of the MPA loading station 112. For example, this may be accomplished with telescoping columns, walls, etc. that can be raised and lowered. In an embodiment, one or more vacuum channels 119 may optionally be formed in the support structure(s) 118 and optionally the base structure 109 to provide suction force to help secure the MPAs 103 on the support structures 118. Being able to raise and lower the MPAs 103 with the support structure(s) 118 may allow the active surface of the MPAs 103 including the transfer heads 115 to remain protected from potential contamination.

Figure 5:
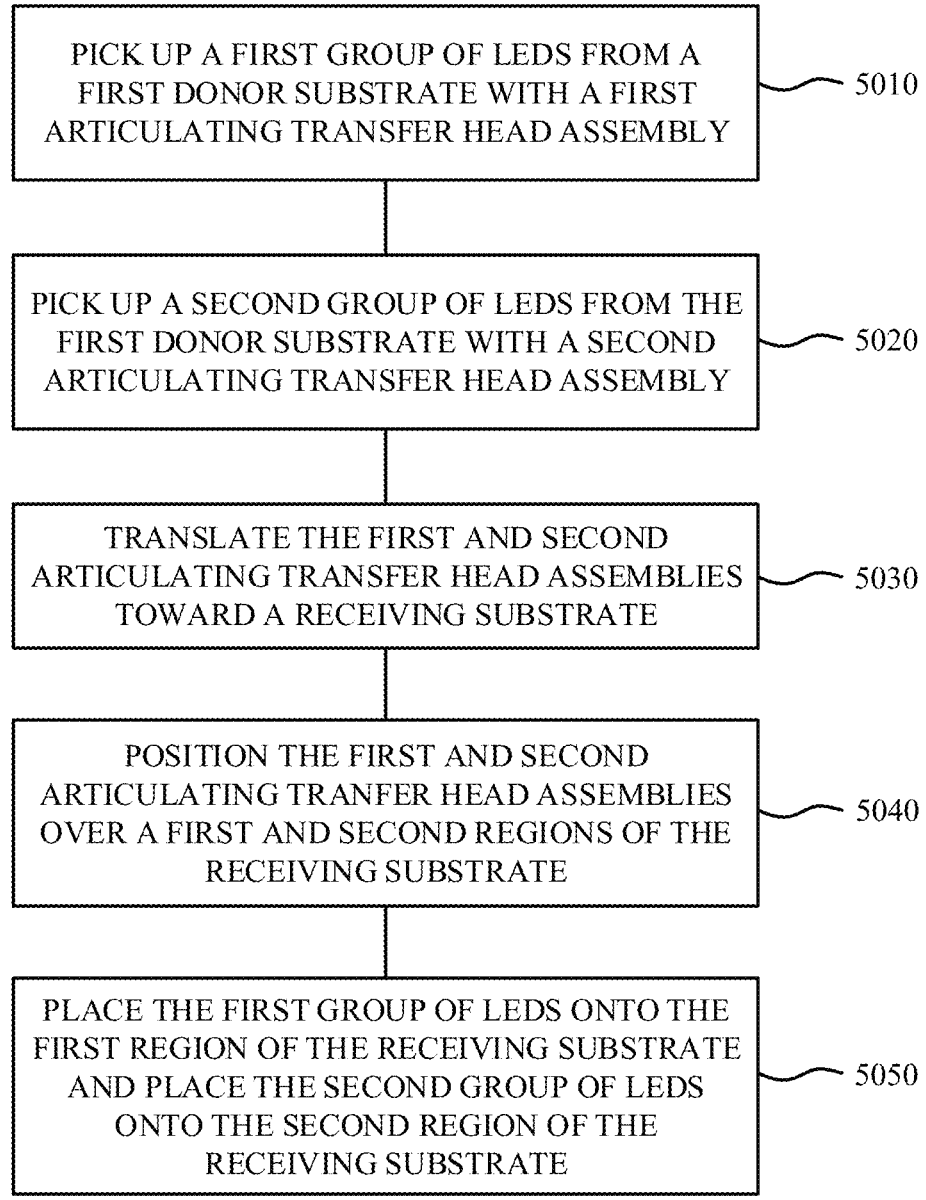
FIG. 5 is a process flow for a sequence of transferring multiple groups of LEDs with multiple articulating transfer head assemblies in accordance with an embodiment.
Figure 6:
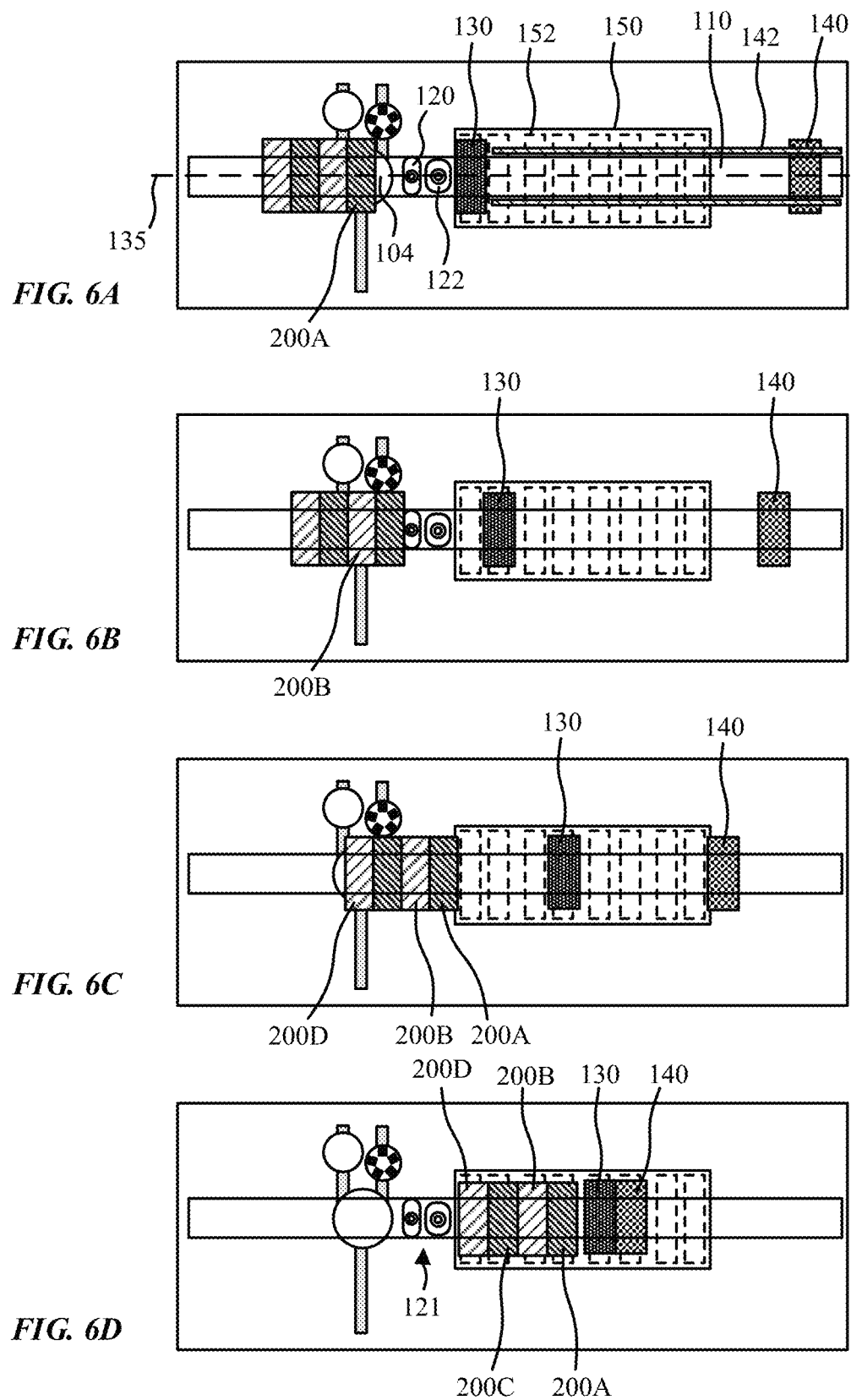
FIGS. 6A-6D are schematic cross-sectional side view illustrations for a sequence of transferring multiple groups of LEDs with multiple articulating transfer head assemblies in accordance with an embodiment.

It will be appreciated that transfer sequences in accordance with embodiments can be carried out in a variety of sequences, and using various combinations of stations or subsystems. FIG. 5 is a process flow for a sequence of transferring multiple groups of LEDs with multiple articulating transfer head assemblies in accordance with an embodiment. FIGS. 6A-6D are schematic cross-sectional side view illustrations for a sequence of transferring multiple groups of LEDs with multiple articulating transfer head assemblies in accordance with an embodiment. In interest of clarity and conciseness the following description of the process flow of FIG. 5 is made with regard to the sequence illustrated in FIGS. 6A-6D. In particular, the processing sequences illustrated in FIG. 5 and FIGS. 6A-6D illustrate interoperability of a plurality of articulating transfer head assemblies 200 with a counter-weight 140 and review camera 130. It is to be appreciated that the illustrated sequences are exemplary, and the MTT 100 can be operated in other complex sequences. Specifically, while sequential pick operations are described for each articulating transfer head assembly 200, multiple articulating transfer head assemblies 200 can simultaneously pick up from multiple donor substrates as previously described with regard to FIG. 3.

Referring to FIG. 6A at operation 5010 a first group of LEDs (or other micro devices) is picked up from a first donor substrate with a first articulating transfer head assembly 200A. In this process sequence, the plurality of articulating transfer head assemblies 200 is labeled as 200A, 200B, 200C, 200D. This may include translating the donor substrate stage 104 underneath the main translation track 110. The first articulating transfer head assembly 200A then contacts the MPA 103 transfer heads 115 with the plurality of LEDs on a donor substrate to pick up a first group of LEDs from the donor substrate. Still referring to FIG. 6A the motion of translating the first articulating transfer head assembly 200 over the donor substrate stage 104 may be accompanied by simultaneous movement of the review camera 130 over a region 152 on the receiving substrate 150 that will be receiving LEDs. In the particular embodiment illustrated, the review camera 130 is located over a region 152 which the fourth articulating transfer head assembly 200D will transfer LEDs to. This may minimize total transfer distance of the review camera 130 after all LEDs have been picked up, though embodiments are not limited to this manner of operation. Additionally, the counter-weight 140 may be translated to a position along the main translation track 110 or counter translation track 142 to counter the movement of the articulating transfer head assembly(s) 200A-200D, as well as the review camera 130. In interest of clarity, the counter translation track 142 and longitudinal axis 135 are only illustrated in FIG. 6A, and are not included in FIGS. 6B-6D.

At operation 5020 a second articulating transfer head assembly 200B is positioned over the same donor substrate and donor substrate stage 104, and contacted with the donor substrate to pick up a second group of LEDs. As shown in FIG. 6B this may be accompanied by positioning the review camera over a region 152 on the receiving substrate 150 that will be receiving the LEDs from the third articulating transfer head assembly 200C. Additionally, the counter-weight 140 may be moved an equal but opposite distance along the main translation track 110 or counter translation track 142 as the articulating transfer head assembly(s) 200A-200D.

FIG. 6C illustrates a continuance of this sequence where the third articulating transfer head assembly 200C has already picked up a third group of LEDs, and now the fourth articulating transfer head assembly 200D is picking up a fourth group of LEDs. Similarly, the review camera can now be positioned over a region 152 on the receiving substrate 150 that will be receiving the LEDs from the first articulating transfer head assembly 200A. Additionally, the counter-weight 140 may be moved an equal but opposite distance along the main translation track 110 or counter translation track 142 as the articulating transfer head assembly(s) 200A-200D.

Referring now to FIG. 6D, at operation 5030 the plurality of articulating transfer head assemblies 200A, 200B, 200C, 200D is translated along the main translation track 110 toward the receiving substrate 150. During this translation, one or more, or all, of the articulating transfer head assemblies 200A, 200B, 200C, 200D can be translated over the inspection station 121. It is also possible one or more of the articulating transfer head assemblies could have been translated over, and inspected by, the inspection station 121 during the previous operations of picking up the multiple groups of LEDs. For example, this is illustrated in FIG. 6C, which may further reduce total distance traveled along the main translation track 110.

Still referring to FIG. 6D, at operation 5040 the plurality of articulating transfer head assemblies 200A, 200B, 200C, 200D can then be positioned over corresponding separate regions 152 of the receiving substrate 150, and the different groups of LEDs can then be placed onto the different regions 152 of the receiving substrate 150 at operation 5050. This placement may be performed sequentially, or simultaneously to increase throughput.

The processing sequence illustrated in FIGS. 6A-6D can be modified in a number of ways. For example, the plurality of articulating transfer head assemblies can pick up from a plurality of different donor substrates held on corresponding donor substrate stages 104. Picking up from the multiple donor substrate stages can be sequential, or simultaneous. In an embodiment, the first and third articulating transfer head assemblies 200A, 200C pick up from two different donor substrate stages 104 simultaneously, followed by translation, and picking up from the same donor substrate stages 104 with the second and fourth articulating transfer head assemblies 200B, 200D. Placement can also be performed sequentially or simultaneously. In an embodiment, one or more of the articulating transfer head assemblies has a single pick up operation, followed by multiple placement operations onto the same or different regions 152 of the receiving substrate 150.

Figure 7:
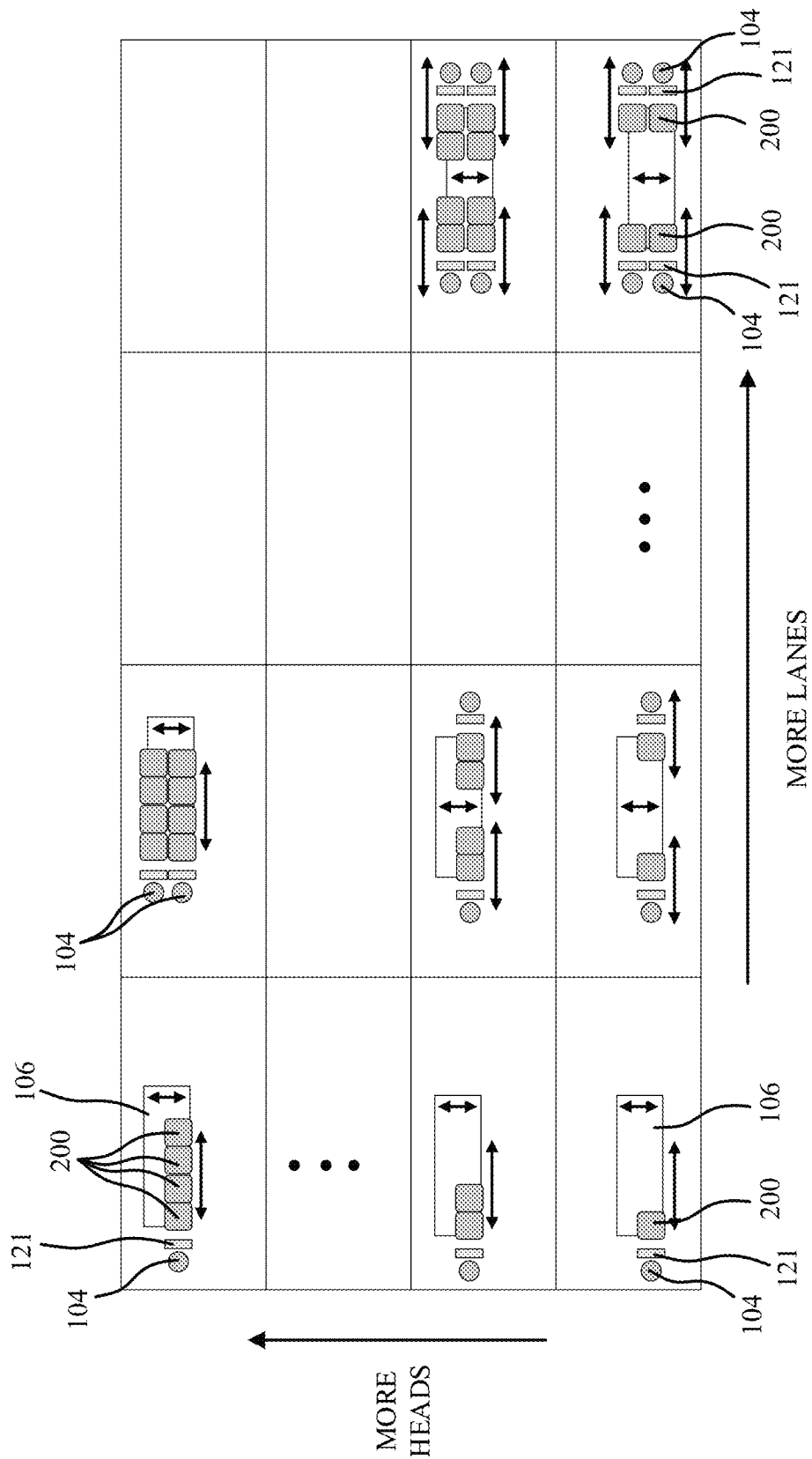
FIG. 7 is a graphical illustration showing the addition of multiple articulating transfer head assemblies and transfer lanes for increasing throughput in accordance with embodiments.

In accordance with embodiments, MTT 100 throughput can be increased by incorporating various combinations of multiple articulating transfer head assemblies 200 and multiple transfer lanes. This is schematically illustrated in FIG. 7, where the bottom left illustration is that of an MTT including a single donor substrate holder 104, inspection station 121, and articulating transfer head assembly 200. As shown, throughput can be increased by addition of more articulating transfer head assemblies 200 or more transfer lanes. Transfer lanes can be added by either populating the receiving substrate stage 106 from different sides, and/or adding parallel transfer lanes (and hence main translation tracks) from the same side of the receiving substrate stage 106. Accordingly, while the embodiments described and illustrated with regard to FIGS. 1A-6D have been made with regard to a single transfer lane (and main translation track) from a single side of the receiving substrate stage 106, the embodiments can also be applied in an MTT system with multiple transfer lanes, and different numbers of articulating transfer head assemblies located on one or more sides (e.g. opposite sides) of the receiving substrate stage 106.

Figure 8:
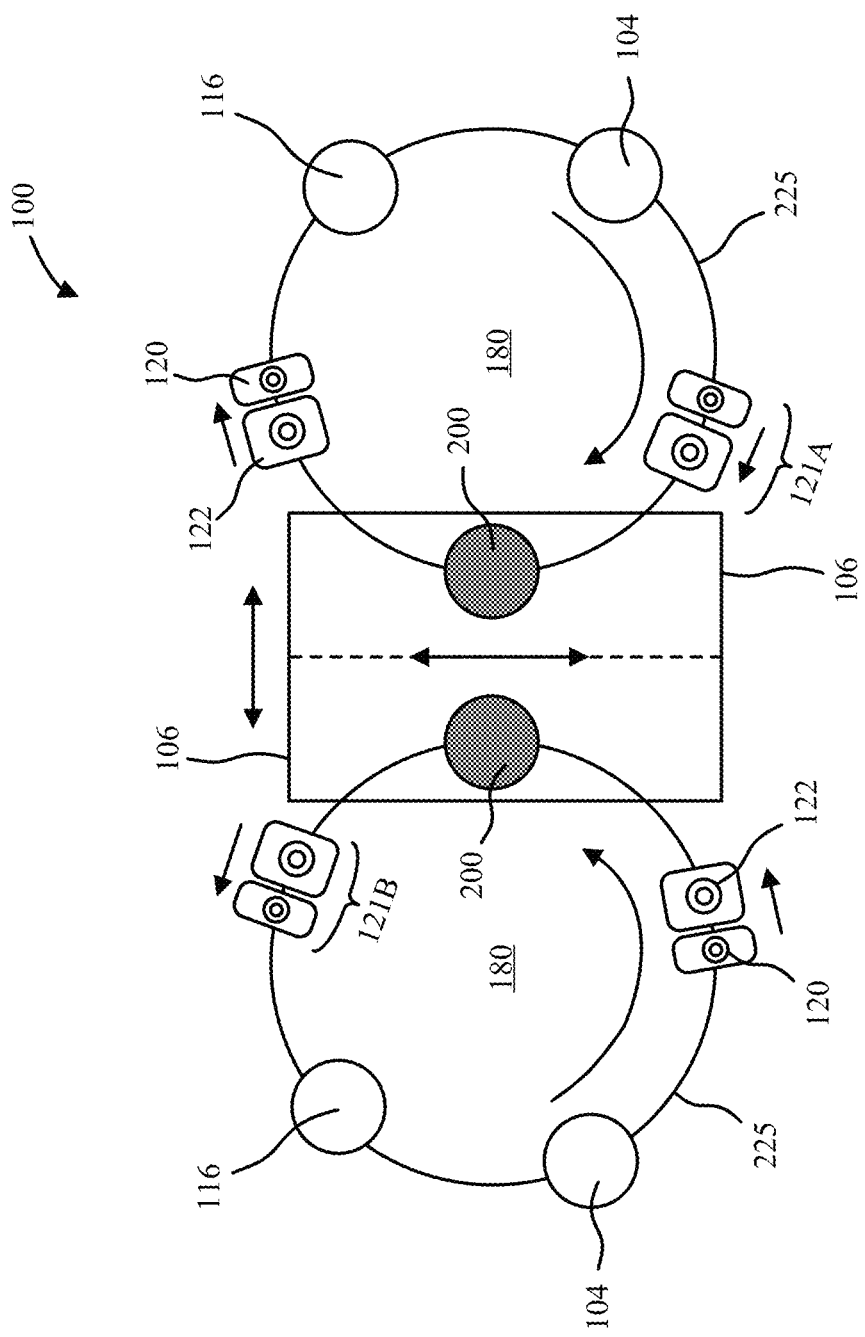
FIG. 8 is a schematic top view illustration of an MTT including a plurality of subsystems arranged in a loop architecture in accordance with an embodiment.

Referring now to FIG. 8 a schematic top view illustration is provided of an MTT 100 assembly including a plurality of subsystems (or stations) arranged in a loop architecture in accordance with an embodiment. For example, the loop may be circular, oval, etc. where the one or more articulating transfer head assemblies 200 can be sequentially moved or rotated into position over different subsystems. In particular, FIG. 8 illustrates an MTT including two groups of subsystems (or stations) arranged in a loop architecture. In an embodiment, an MTT 100 assembly includes a plurality of subsystems including a donor substrate stage 104, a pre-placement inspection station 121A, a receiving substrate stage 106, and a post-placement inspection station 121B. The MTT 100 additionally includes an articulating transfer head assembly 200, and a motion system 225 to position the articulating transfer head assembly 200 over the plurality of subsystems in a looped sequence. For example, the motion system 225 may include a number of movable stages, arms, translation tracks, etc. The articulating transfer head assembly 200 may be part of a carousel 180 of a plurality of articulating transfer head assemblies that can be incremented over the plurality of subsystems in the looped sequence. Thus, multiple articulating transfer head assemblies 200 can be included so that each rotates over a specific subsystem, for example, donor substrate stage 104 (or MPA loading station 112), pre-placement inspection station 121A (e.g. upward facing inspection camera 120 and/or line scan camera 122), receiving substrate stage 106 (e.g. to hold receiving substrate 150), post-placement inspection station 121B (e.g. upward facing inspection camera 120 and/or line scan camera 122), or cleaning station 116. While a circular looped architecture is illustrated, this is exemplary any other configurations are possible such as elliptical, oval, ovoid, etc. where an articulating transfer head assembly 200 can be returned to a starting location along a different path from which it leaves the starting location. In an embodiment, the motion system and upward facing inspection camera 120 and line scan camera 122 are arranged so that the multiple articulating transfer head assemblies 200 are scanned in the same order, for both pre-placement and post-placement. The carousel 180 may increment at every cycle. Thus, the cycle time of the MTT 100 may include the motion time plus the longest step out of the various stations (e.g. placing operation on the receiving substrate). In the particular embodiment illustrated in FIG. 8 two carousels are located on opposite sides of the receiving substrate stage 106.

Figure 9:
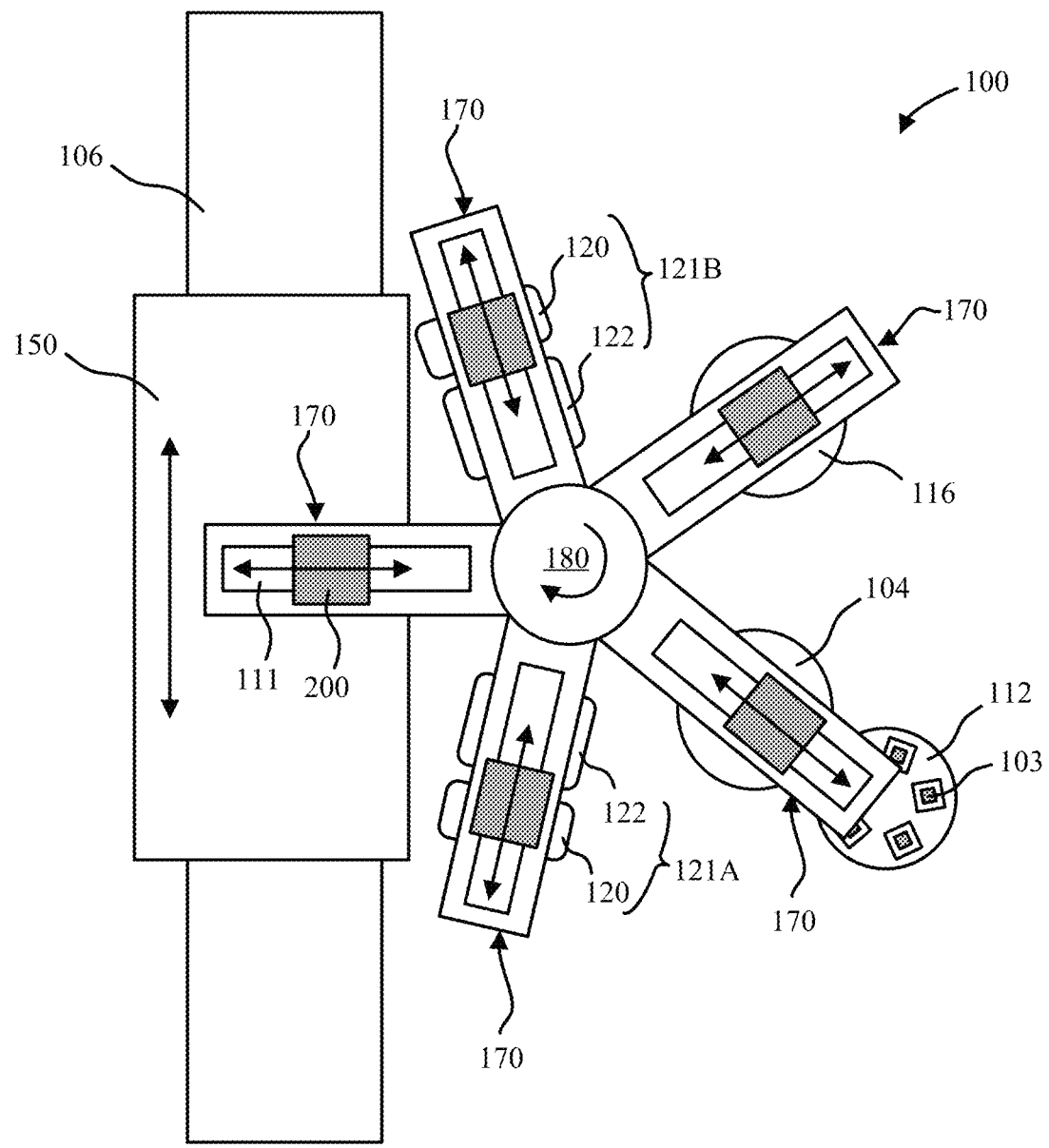
FIG. 9 is a schematic top view illustration of an MTT including a plurality of arms that are positionable over a plurality of subsystems arranged in a loop architecture in accordance with an embodiment.

FIG. 9 is a schematic top view illustration of an MTT 100 including a carousel 180 and separate arms 170 that are positionable over a plurality of subsystems arranged in a loop architecture in accordance with an embodiment. It is to be appreciated that while each arm 170 is illustrated as being a discrete piece, the MTT 100 may be more interconnected, and each arm 170 may also be a portion of an integrated system. In an embodiment each arm may include a corresponding articulating transfer head assembly 200. Furthermore, each arm may include a corresponding translation arm track 111 to which the articulating transfer head assembly 200 is attached and translatable. For example, this may be a linear track along a length of the arm 170. In an embodiment, an MPA loading station 112 may be located adjacent to the donor substrate stage 104 such that the articulating transfer head assembly 200 for each arm is translatable along the corresponding translation arm track 111 between the donor substrate stage 104 and the MPA loading station 112. In this manner the MPA loading station 112 can be integrated into the same subsystem with the donor substrate stage 104 so that a separate increment is not necessary for every cycle, and instead an articulating transfer head assembly 200 can be moved to the MPA loading station 112 only when service is required.

In utilizing the various aspects of the embodiments, it would become apparent to one skilled in the art that combinations or variations of the above embodiments are possible for transferring an array of micro devices. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration. In particular, while the above embodiments have been specifically described with regard to LEDs, and more particularly to micro LEDs, the MTT 100 and sequences can also be applied to other applications to increase throughput for the population of devices, and specifically micro devices. Accordingly, the above descriptions and illustrations of LEDs and display substrates are generically applicable to other micro device applications and receiving substrates that can be populated using the MTT 100 and transfer sequences described.

What is claimed is:

1. A mass transfer tool comprising:
   a receiving substrate stage;
   a donor substrate stage;
   a main translation track;
   a plurality of articulating transfer head assemblies coupled with the main translation track, each articulating transfer head assembly translatable along the main translation track between the donor substrate stage and the receiving substrate stage, and
   a review camera coupled with the main translation track, wherein the review camera is translatable along the main translation track over the receiving substrate independently of the plurality of articulating transfer head assemblies.

2. The mass transfer tool of claim 1, wherein each articulating transfer head assembly is adjustable in six degrees of motion.

3. The mass transfer tool of claim 2, wherein the plurality of articulating transfer head assemblies comprises a first set of articulating transfer head assemblies attached to a first carriage coupled to the main translation track, and a second set of articulating transfer head assemblies attached to a second carriage coupled to the main translation track.

4. The mass transfer tool of claim 1, further comprising a donor substrate stage translation track, wherein the donor substrate stage is translatable along the donor substrate stage translation track between an operable location directly overlapping the main translation track and an inoperable location away from the main translation track.

5. The mass transfer tool of claim 4, further comprising a second donor substrate stage translation track, wherein a second donor substrate stage is translatable along the second donor substrate stage translation track between a second operable location directly overlapping the main translation track and a second inoperable location away from the main translation track, and the second donor substrate stage is adjustable in at least two degrees of motion.

6. The mass transfer tool of claim 5, wherein one of the at least two degrees of motion is parallel to a longitudinal axis of the main translation track.

7. The mass transfer tool of claim 4, further comprising a cleaning station translation track, wherein a cleaning station is translatable along the cleaning station translation track between a cleaning location directly overlapping the main translation track and a non-cleaning location away from the main translation track.

8. The mass transfer tool of claim 4, further comprising a loading station translation track, wherein a micro pick up array (MPA) loading station is translatable along the loading station translation track between a loading location directly overlapping the main translation track and a non-loading location away from the main translation track.

9. The mass transfer tool of claim 8, wherein the MPA loading station includes a plurality of support structures that can be raised relative to a base structure of the MPA loading station.

10. The mass transfer tool of claim 1, further comprising a counter-weight, wherein the counter-weight is translatable parallel to a longitudinal axis of the main translation track over the receiving substrate state independently of the plurality of articulating transfer head assemblies and the review camera.

11. The mass transfer tool of claim 10, wherein the counter-weight is coupled with a counter translation track located adjacent to the main translation track.

12. The mass transfer tool of claim 1, further comprising an inspection station, wherein the plurality of articulating transfer head assemblies is translatable along the main translation track and directly over the inspection station.

13. A mass transfer tool assembly comprising:
   a plurality of subsystems including a donor substrate stage, pre-placement inspection station, a receiving substrate stage, and a post-placement inspection station;
   an articulating transfer head assembly; and
   a motion system to position the articulating transfer head assembly over the plurality of subsystems in a looped sequence;
   wherein the articulating transfer head assembly is a part of a plurality of articulating transfer head assemblies that can be incremented over the plurality of subsystems in the looped sequence.

14. The mass transfer tool of claim 13, wherein each articulating transfer head assembly is adjustable in six degrees of motion.

15. The mass transfer tool of claim 13, wherein the motion system includes a plurality of arms, each arm including a corresponding articulating transfer head assembly.

16. The mass transfer tool of claim 15, wherein each arm includes a corresponding translation arm track to which the corresponding articulating transfer head assembly is attached.

17. The mass transfer tool of claim 16, further comprising a micro pick up array loading station adjacent the donor substrate stage, wherein the articulating transfer head assembly for each arm is translatable along the corresponding translation arm track between the donor substrate stage and the micro pick up array loading station.

18. The mass transfer tool of claim 13, wherein the plurality of subsystems includes a cleaning station.

19. The mass transfer tool of claim 18, wherein the cleaning station includes a substrate with a tacky coating or an electrostatic pattern.

20. A mass transfer tool comprising:
a receiving substrate stage;
a donor substrate stage;
a main translation track;
a plurality of articulating transfer head assemblies coupled with the main translation track, each articulating transfer head assembly translatable along the main translation track between the donor substrate stage and the receiving substrate stage; and
a loading station translation track, wherein a micro pick up array (MPA) loading station is translatable along the loading station translation track between a loading location directly overlapping the main translation track and a non-loading location away from the main translation track.

21. The mass transfer tool of claim 20, further comprising a donor substrate stage translation track, wherein the donor substrate stage is translatable along the donor substrate stage translation track between an operable location directly overlapping the main translation track and an inoperable location away from the main translation track.

22. The mass transfer tool of claim 20, wherein the MPA loading station includes a plurality of support structures that can be raised relative to a base structure of the MPA loading station.

* * * * *